US012769120B2

(12) United States Patent
Tso et al.

(10) Patent No.: US 12,769,120 B2
(45) Date of Patent: Oct. 20, 2026

(54) WINDSHIELD AND WINDSHIELD ASSEMBLY

(71) Applicant: FUYAO GLASS INDUSTRY GROUP CO., LTD., Fujian (CN)

(72) Inventors: Fai Tso, Fuqing (CN); Jielin Zhang, Fuqing (CN); Xiaorong Zhang, Fuqing (CN); Guoshui Lu, Fuqing (CN); Kohta Fukuhara, Fuqing (CN)

(73) Assignee: FUYAO GLASS INDUSTRY GROUP CO., LTD., Fuqing (CN)

( * ) Notice: Subject to any disclaimer, the term of this patent is extended or adjusted under 35 U.S.C. 154(b) by 222 days.

(21) Appl. No.: 18/742,150

(22) Filed: Jun. 13, 2024

(65) Prior Publication Data

US 2024/0337835 A1 Oct. 10, 2024

Related U.S. Application Data

(63) Continuation of application No. PCT/CN2022/070125, filed on Jan. 4, 2022.

(51) Int. Cl.

| | |
|---|---|
| ***G02B 27/01*** | (2006.01) |
| ***B32B 17/10*** | (2006.01) |
| ***B60J 1/00*** | (2006.01) |
| ***B60J 1/02*** | (2006.01) |
| ***B60K 35/231*** | (2024.01) |
| ***C23C 14/06*** | (2006.01) |

(Continued)

(52) U.S. Cl.
CPC .... *G02B 27/0101* (2013.01); *B32B 17/10036* (2013.01); *B32B 17/10201* (2013.01);
(Continued)

(58) Field of Classification Search
CPC .................................................. G02B 27/0101
See application file for complete search history.

(56) References Cited

U.S. PATENT DOCUMENTS

2003/0035939 A1 2/2003 Muromachi et al.
2021/0308990 A1 10/2021 Li et al.

FOREIGN PATENT DOCUMENTS

CN 102922825 A 2/2013
CN 110228236 A 9/2019
(Continued)

OTHER PUBLICATIONS

International Search Report dated Aug. 10, 2022 issued in PCT/CN2022/070125.
(Continued)

*Primary Examiner* — Christina Y. Leung
(74) *Attorney, Agent, or Firm* — Scully, Scott, Murphy & Presser, P.C.

(57) ABSTRACT

A windshield includes an outer glass, a polymer interlayer, and an inner glass. The inner glass has a third surface and a fourth surface opposite the third surface. The third surface faces the polymer interlayer. The windshield has an information collection region and a non-information collection region. An enhanced reflection coating is provided on the fourth surface. The enhanced reflection coating covers the information collection region and the non-information collection region. The enhanced reflection coating is configured to improve a reflectivity of the non-information collection region for P-polarized light of 380 nm~780 nm. A dielectric coating is further provided in the information collection region. The dielectric coating disposed on a side face of the enhanced reflection coating away from the fourth surface.

19 Claims, 4 Drawing Sheets

(51) Int. Cl.
*C23C 14/08* (2006.01)
*C23C 14/35* (2006.01)
*G02B 1/11* (2015.01)
*G02B 1/18* (2015.01)

(52) U.S. Cl.
CPC .... *B32B 17/1044* (2013.01); *B32B 17/10761* (2013.01); *B60J 1/001* (2013.01); *B60J 1/02* (2013.01); *B60K 35/231* (2024.01); *C23C 14/0676* (2013.01); *C23C 14/083* (2013.01); *C23C 14/35* (2013.01); *G02B 1/11* (2013.01); *G02B 1/18* (2015.01); *B32B 2307/728* (2013.01); *B32B 2605/00* (2013.01); *B60K 2360/23* (2024.01); *B60K 2360/25* (2024.01); *G02B 2027/0118* (2013.01); *G02B 2027/014* (2013.01); *G02B 2027/0194* (2013.01)

(56) References Cited

FOREIGN PATENT DOCUMENTS

| | | | |
|---|---|---|---|
| CN | 110435258 | A | 11/2019 |
| CN | 111703151 | A | 9/2020 |
| CN | 112424654 | A | 2/2021 |
| CN | 113031276 | A | 6/2021 |
| JP | 2002348151 | A | 12/2002 |
| JP | 2003313052 | A | 11/2003 |
| JP | 2019196299 | A | 11/2019 |
| JP | 2021127286 | A | 9/2021 |
| JP | 2024506018 | A | 2/2024 |
| KR | 10-2014-0011348 | A | 1/2014 |
| KR | 10-2020-0123455 | A | 10/2020 |
| WO | 2020017495 | A1 | 1/2020 |
| WO | 2020025360 | A1 | 2/2020 |
| WO | 2020203989 | A1 | 10/2020 |

OTHER PUBLICATIONS

Office Action for JP Application No. 2024-536239 dated Apr. 28, 2025.

Extended European search report dated Dec. 13, 2024 received in European Patent Application No. 22917693.8.

Notice of Registration dated Aug. 14, 2024 received in Chinese Patent Application No. 202280081779.7.

Korean Request for the Submission of an Opinion dated Mar. 18, 2026 received in Korean Application No. 10-2024-7020233.

WINDSHIELD AND WINDSHIELD ASSEMBLY

CROSS-REFERENCE TO RELATED APPLICATION

This application is a continuation of International Application No. PCT/CN2022/070125 filed Jan. 4, 2022, the disclosure of which is hereby incorporated by reference in its entirety.

TECHNICAL FIELD

The disclosure relates to the technical field of glass products, and in particular, to a windshield and a windshield assembly.

BACKGROUND

With the development of autonomous driving technology and higher and higher requirements of people for additional functions of a front windshield of an automobile, the front windshield of the automobile is provided with more and more functions, such as a head-up display (HUD) function, an electric heating defrosting and defogging function, an infrared reflecting and heat insulation function, and an ultraviolet protection function.

A light detection and ranging (LiDAR) is a radar system that detects a position, velocity, and other characteristics of an objects by emitting laser beams. Due to its high detection accuracy and precision, the LiDAR plays an irreplaceable role in the field of autonomous driving. The LiDAR can be mounted to the automobile through two manners: external mounting and internal mounting. The external mounting is usually to mount the LiDAR to a roof, an engine cover, a fender, or a front grille of the automobile, exposing the LiDAR to the external environment, which means that weather conditions and environmental factors such as rain, wind, dust, high temperature, and low temperature can affect the accuracy of the LiDAR. The internal mounting is to mount the LiDAR inside a vehicle cockpit, thereby avoiding the effects of weather and environment.

For an internally mounted LiDAR, signals of a wavelength of 905 nm or a wavelength of 1550 nm emitted/received by the LiDAR need to pass through the front windshield. However, a current front windshield, designed for heat insulation, has a high blocking rate for infrared light of 780 nm~2500 nm, failing to meet requirements of normal operation and high precision measurement of the LiDAR.

SUMMARY

An objective of the disclosure is to provide a windshield and a windshield assembly. The windshield has high transmittance for signals of a light detection and ranging (LiDAR), satisfying the usage requirements of an internally mounted LiDAR, while also enabling a head-up display (HUD) function.

A windshield is provided in the disclosure. The windshield includes an outer glass, a polymer interlayer, and an inner glass. The polymer interlayer is sandwiched between the outer glass and the inner glass. The outer glass has a first surface and a second surface opposite the first surface. The second surface faces the polymer interlayer. The inner glass has a third surface and a fourth surface opposite the third surface. The third surface faces the polymer interlayer. The windshield has an information collection region and a non-information collection region.

An enhanced reflection coating is provided on the fourth surface. The enhanced reflection coating covers the information collection region and the non-information collection region. The enhanced reflection coating is configured to improve a reflectivity of the non-information collection region for P-polarized light of 380 nm~780 nm.

A dielectric coating is further provided in the information collection region. The dielectric coating is disposed on a side face of the enhanced reflection coating away from the fourth surface. The dielectric coating and the enhanced reflection coating are configured to improve a transmittance of the information collection region for near-infrared light of 780 nm~980 nm.

The enhanced reflection coating has a thickness of 100 nm~500 nm and includes at least one laminated structure. Each of the at least one laminated structure includes a high refractive-index layer and a low refractive-index layer sequentially deposited from the fourth surface in a direction away from the outer glass. The high refractive-index layer has a refractive index of 1.7~2.7. The low refractive-index layer has a refractive index of 1.3~1.6.

The high refractive-index layer includes multiple high refractive-index sub-layers. Alternatively, the enhanced reflection coating includes at least two laminated structures. The multiple high refractive-index layers include at least one first high refractive-index layer and at least one second high refractive-index layer. Each of the at least one first high refractive-index layer is a single-layer high refractive-index sub-layer. Each of the at least one-second-high refractive-index layer includes multiple high refractive-index sub-layers.

Alternatively or additionally, the low refractive-index layer includes multiple low refractive-index sub-layers. Alternatively, the enhanced reflection coating includes at least two laminated structures. The multiple low refractive-index layers include at least one first low refractive-index layer and at least one second low refractive-index layer. Each of the at least one first low refractive-index layer is a single-layer low refractive-index sub-layer. Each of the at least one second low refractive-index layer includes multiple low refractive-index sub-layers.

Each of the at least one second high refractive-index layers includes a first high refractive-index sub-layer and a second high refractive-index sub-layer stacked in sequence. The first high refractive-index sub-layer is closer to the fourth surface than the second high refractive-index sub-layer. The first high refractive-index sub-layer has a refractive index of 1.7·~2.04. The second high refractive-index sub-layer has a refractive index of 2.05·~2.7.

The first high refractive-index sub-layer is made of $SiO_xN_y$, where $1<x\leq3$, $1<y<3$, the first high refractive-index sub-layer has a thickness of 27 nm·~51 nm, and the second high refractive-index sub-layer has a thickness of 45 nm·~60 nm.

The dielectric coating has a thickness of 10 nm·~140 nm. The dielectric coating includes at least one dielectric sub-layer, and each of the at least one dielectric sub-layer has a refractive index of 1.4·~2.7.

Each of the at least one dielectric sub-layers has a refractive index of 2.0·~2.7, and is made of at least one of $ZnSnO_x$, $ZnAlO_x$, $TiO_x$, $NbO_x$, $SiN_x$, $ZrO_x$, or $ZrSiN_x$.

Each of the at least one dielectric sub-layers has a refractive index of 2.2~2.7, and the dielectric coating has a thickness of 10 nm~70 nm.

The information collection region has a transmittance greater than or equal to 80% for near-infrared light of 780 nm~980 nm incident at an incident angle of 65°. The non-information collection region has a reflectivity greater than or equal to 20% for P-polarized light of 380 nm~780 nm incident at an incident angle of 65°.

The non-information collection region has a reflectivity of Y1 for P-polarized light of 629 nm incident at an incident angle of 65°, a reflectivity of Y2 for P-polarized light of 529 nm incident at an incident angle of 65°, and a reflectivity of Y3 for P-polarized light of 469 nm incident at an incident angle of 65°.

$|Y1-Y2|\leq 2.5\%$, $|Y2-Y3|\leq 2.5\%$, and $|Y1-Y3|\leq 2.5\%$.

$Y1\geq 20\%$, $Y2\geq 20\%$, and $Y3\geq 20\%$.

The windshield further includes a hydrophobic coating stacked on a side face of the dielectric coating away from the enhanced reflection coating.

The hydrophobic coating has a water contact angle greater than 110°.

The hydrophobic coating has a surface energy less than or equal to 0.3 $Jm^{-2}$, and has a refractive index less than or equal to 1.6.

A windshield assembly is further provided. The windshield assembly includes a LiDAR, an HUD projection device, and the above-mentioned windshield. The LiDAR is configured to emit/receive near-infrared light of 780 nm~980 nm that is to pass through the information collection region. The HUD projection device is configured to generate the P-polarized light of 380 nm~780 nm that is to be incident onto the non-information collection region.

A proportion of a P-polarized component in polarized light generated by the HUD projection device is greater than or equal to 90%.

A proportion of a P-polarized component in the near-infrared light emitted by the LiDAR is greater than or equal to 50%.

A proportion of a P-polarized component in polarized light generated by the HUD projection device is 100%. A proportion of a P-polarized component in the near-infrared light emitted by the LiDAR is 100%.

In the windshield and the windshield assembly provided in the disclosure, the enhanced reflection coating is provided and the dielectric coating is locally added, thereby not only increase the reflectivity of the windshield for P-polarized light of 380 nm~780 nm, but also increase the transmittance of the windshield for near-infrared light of 780 nm~980 nm. This enables compatibility of the LiDAR with the HUD projection device, achieving the high-precision measurement of the LiDAR and more uniform red, green, and blue colors of an HUD display image. It ensures normal operation of the LiDAR within a maximum horizontal field of view (FOV) of 120°, thereby improving the detection range and precision of the LiDAR, and achieving the stability and accuracy of the operation of the LiDAR that is internally mounted.

DETAILED DESCRIPTION

The disclosure will be further described in detail hereinafter with reference to the accompanying drawings.

Figure 1:
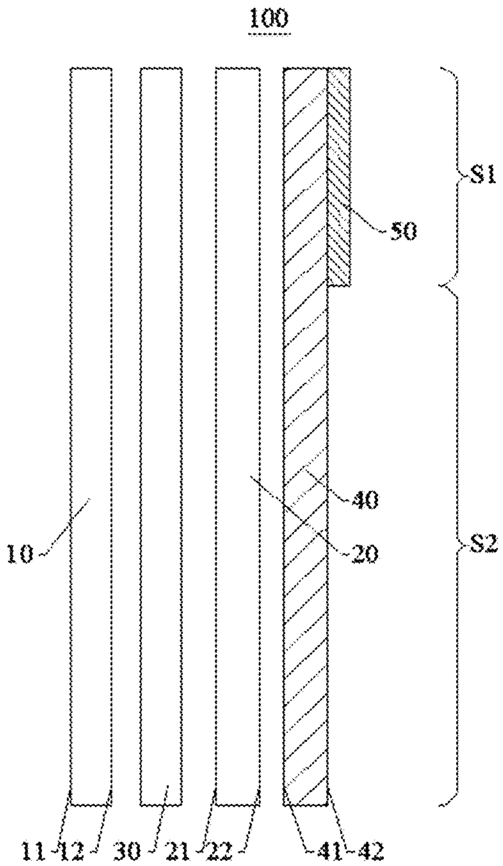
FIG. 1 is a schematic cross-sectional structural view of a windshield according to an embodiment of the disclosure.
Figure 2:
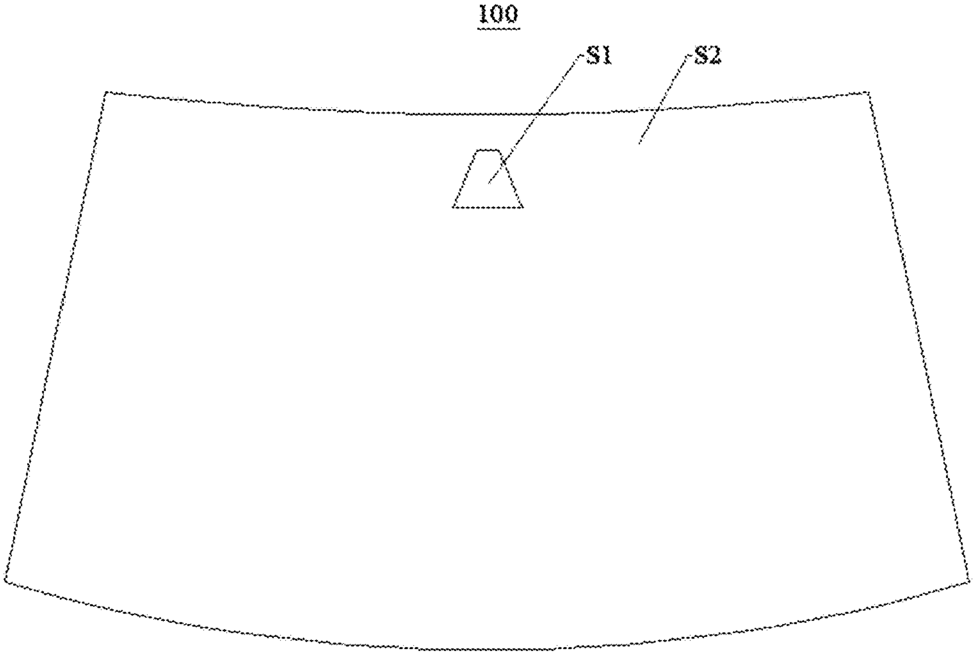
FIG. 2 is a top view of the windshield in FIG. 1.

Referring to FIGS. 1 and 2, FIG. 1 is a schematic cross-sectional structural view of a windshield 100 according to an embodiment of the disclosure, and FIG. 2 is a top view of the windshield 100 in FIG. 1. The windshield 100 includes an interlayer glass, an enhanced reflection coating 40, and a dielectric coating 50 laminated in sequence. The interlayer glass includes an outer glass 10, a polymer interlayer 30, and an inner glass 20 laminated in sequence. The polymer interlayer 30 is sandwiched between the outer glass 10 and the inner glass 20. In the case where the windshield 100 is mounted to a vehicle, the inner glass 20 faces the interior of the vehicle. The enhanced reflection coating 40 is laminated on the inner glass 20. The dielectric coating 50 is laminated on the enhanced reflection coating 40.

The windshield 100 has an information collection region S1 and a non-information collection region S2. The information collection region S1 does not overlaps the non-information collection region S2. The information collection region S1 is used for providing a signal transmission window for information collection of an information collection system (not illustrated). In the case where the windshield 100 is mounted to a vehicle, the information collection system is disposed inside the vehicle. Signals emitted and/or received by the information collection system may all pass through the information collection region S1 of the windshield 100. The information collection system S1 in the disclosure includes, but is not limited to, a light detection and ranging (LiDAR), an optical sensor, an infrared camera, a visible light camera, etc. In this embodiment, an example that the information collection system is the LiDAR is taken for illustration. At least part of the non-information collection region S2 is used for a head-up display (HUD). That is, at least part of the non-information collection region S2 serves as a display region of the HUD to display information such as driving speed, dynamic navigation, road safety alerts, and commercial district information. A maximum ratio of the area of the information collection region S1 to the area of the windshield 100 is 20%. A minimum ratio of the area of the non-information collection region S2 to the area of the windshield 100 is 50%.

The outer glass 10 has a first surface 11 and a second surface 12 opposite the first surface 11. The second surface 12 faces the polymer interlayer 30. The inner glass 20 has a third surface 21 and a fourth surface 22 opposite the third surface 21. The third surface 21 faces the polymer interlayer 30. In the case where the windshield 100 is mounted to a vehicle, the fourth surface 22 of the inner glass 20 faces the information collection system mounted inside the vehicle.

The enhanced reflection coating 40 is laminated on the fourth surface 22 of the inner glass 20 and covers the information collection region S1 and the non-information collection region S2. Specifically, the enhanced reflection coating 40 has a first side face 41 and a second side face 42 opposite the first side face 41. The first side face 41 is in contact with the fourth surface 22 of the inner glass 20. The second side face 42 is away from the fourth surface 22. In the disclosure, the enhanced reflection coating 40 is configured to improve a reflectivity of the non-information collection region S2 for P-polarized light of 380 nm~780 nm. By providing the enhanced reflection coating 40 on the fourth surface 22, the reflectivity of the non-information collection region S2 for P-polarized light of 380 nm~780 nm can be improved, so that a reflectivity of the non-information collection region S2 for P-polarized light of 380 nm~780 nm incident at an incident angle of 65° is greater than or equal to 20%, thereby achieving a clear HUD function without ghosting.

In one embodiment, the non-information collection region S2 has a reflectivity of Y1 for P-polarized light of 629 nm (i.e., red P-polarized light) incident at an incident angle of 65°, a reflectivity of Y2 for P-polarized light of 529 nm (i.e., green P-polarized light) incident at an incident angle of 65°, and a reflectivity of Y3 for P-polarized light of 469 nm (i.e., blue P-polarized light) incident at an incident angle of 65°, where $|Y1-Y2|\leq2.5\%$, $|Y2-Y3|\leq2.5\%$, $|Y1-Y3|\leq2.5\%$. In other words, a difference between each two of the reflectivity of the non-information collection region S2 for the red P-polarized light, the reflectivity of the non-information collection region S2 for the green P-polarized light, and the reflectivity of the non-information collection region S2 for the blue P-polarized light is controlled to be less than or equal to 2.5%, thereby achieving more uniform red, green, and blue colors of an HUD display image. In some embodiments, $Y1\geq20\%$, $Y2\geq20\%$, and $Y3\geq20\%$.

The dielectric coating 50 is further provided in the information collection region S1. The dielectric coating 50 at least covers the information collection region S1. The dielectric coating 50 is disposed on the second side face 42 of the enhanced reflection coating 40 away from the fourth surface 22. In the case where the dielectric coating 50 is laminated on the enhanced reflection coating 40, the dielectric coating 50 and the enhanced reflection coating 40 cooperatively serve as an anti-reflective structure that has an anti-reflective effect for near-infrared light of 780 nm~980 nm, such that a transmittance of the information collection region S1 for near-infrared light of 780 nm~980 nm can be improved. Thus, the transmittance of the information collection region S1 for near-infrared light of 780 nm~980 nm incident at an incident angle of 65° is greater than or equal to 80%, thereby satisfying the requirements of normal operation and high-accuracy measurement of the LiDAR.

The dielectric coating 50 includes at least one dielectric sub-layer. Each of the at least one dielectric sub-layer has a refractive index of 1.4·~2.7. The dielectric coating 50 may be a single-layer dielectric sub-layer. Alternatively, the dielectric coating 50 may include multiple dielectric sub-layers. The dielectric sub-layer is made of at least one of $SiO_2$, $SiO_xN_y$, $ZnSnO_x$, $ZnAlO_x$, $TiO_x$, $NbO_x$, $SiN_x$, $ZrO_x$, or $ZrSiN_x$. Preferably, the dielectric coating 50 has a thickness of 10 nm~140 nm. That is, a total thickness of the multiple dielectric sub-layers ranges from 10 nm to 140 nm. The dielectric coating 50 can improve the transmittance of the information collection region S1 for near-infrared light of 780 nm~980 nm incident at an incident angle of 0°~60°, 0°~65°, and even 0°~74°, so that the LiDAR can operate normally within a maximum horizontal field of view (FOV) of 120°.

In the disclosure, the enhanced reflection coating 40 includes at least one laminated structure. Each of the at least one laminated structure includes a high refractive-index layer and a low refractive-index layer sequentially deposited from the fourth surface 22 in a direction away from the outer glass 10. The high refractive-index layer has a refractive index of 1.7~2.7. The low refractive-index layer has a refractive index of 1.3~1.6. By providing the laminated structure, the enhanced reflection coating 40 can have an improvement in the reflectivity for P-polarized light of 380 nm~780 nm. Specifically, for example, the enhanced reflection coating 40 includes one laminated structure, that is, the fourth surface 22, one high refractive-index layer, and one low refractive-index layer are arranged in sequence. Alternatively, the enhanced reflection coating 40 includes two laminated structures, that is, the fourth surface 22, one high refractive-index layer, one low refractive-index layer, another high refractive-index layer, another low refractive-index layer are arranged in sequence. Alternatively, the enhanced reflection coating 40 includes three laminated structures, that is, the fourth surface 22, one high refractive-index layer, one low refractive-index layer, another one high refractive-index layer, another low refractive-index layer, yet another high refractive-index layer, and yet another low refractive-index layer are arranged in sequence. Alternatively, the enhanced reflection coating 40 includes four laminated structures, that is, the fourth surface 22, one high refractive-index layer, one low refractive-index layer, another high refractive-index layer, another low refractive-index layer, yet another high refractive-index layer, yet another low refractive-index layer, still another high refractive-index layer, and still another low refractive-index layer are arranged in sequence. Alternatively, the enhanced reflection coating 40 includes five laminated structures, that is, the fourth surface 22, one high refractive-index layer, one low refractive-index layer, another high refractive-index layer, another low refractive-index layer, yet another high refractive-index layer, yet another low refractive-index layer, still another high refractive-index layer, still another low refractive-index layer, still yet another high refractive-index layer, and still yet another low refractive-index layer are arranged in sequence. Alternatively, the enhanced reflection coating 40 may include even more laminate structures.

Each of at least one high refractive-index layer includes at least two high refractive-index sub-layers. Alternatively or additionally, each of at least one low refractive-index layer includes at least two low refractive-index sub-layers. In the disclosure, "A and/or B" indicates A alone, B alone, and both A and B.

Specifically, in one embodiment, the high refractive-index layer includes multiple high refractive-index sub-layers, where "multiple" indicates two or more. That is, in the case where the enhanced reflection coating 40 includes one laminated structure, the high refractive-index layer in one laminated structure includes multiple high refractive-index sub-layers. In the case where the enhanced reflection coating 40 includes two or more laminated structures, the high refractive-index layer in each of the two or more laminated structures includes multiple high refractive-index sub-layers.

In another embodiment, the enhanced reflection coating 40 includes at least two laminated structures. That is, in the case where the enhanced reflection coating 40 includes two or more laminated structures, the enhanced reflection coating 40 includes multiple high refractive-index layers, and each of the multiple high refractive-index layers includes a first high refractive-index layer and a second high refractive-index layer, where the first high refractive-index layer is implemented as at least one first high refractive-index layer, and the second high refractive-index layer is implemented as at least one second high refractive-index layer. Each of the at least one first high refractive-index layer is a single-layer high refractive-index sub-layer. Each of the at least one second high refractive-index layer includes multiple high refractive-index sub-layers.

Specifically, in one embodiment, the low refractive-index layer includes multiple low refractive-index sub-layers. That is, in the case where the enhanced reflection coating 40 includes one laminated structure, the low refractive-index layer in the one laminated structure includes multiple low refractive-index sub-layers. In the case where the enhanced reflection coating 40 includes two or more laminated structures, the low refractive-index layer in each of the two or more laminated structures includes multiple low refractive-index sub-layers.

In another embodiment, the enhanced reflection coating 40 includes at least two laminated structures. That is, in the case where the enhanced reflection coating 40 includes two or more laminated structures, the enhanced reflection coating 40 includes multiple low refractive-index layers, each of the multiple low refractive-index layers includes a first low refractive-index layer and a second low refractive-index layer, where the first low refractive-index layer is implemented as at least one first low refractive-index layer, and the second low refractive-index layer is implemented as at least one second low refractive-index layer. Each of the at least one first low refractive-index layer is a single-layer low refractive-index sub-layer. Each of the at least one second low refractive-index layer includes multiple low refractive-index sub-layers.

Preferably, the enhanced reflection coating 40 has a thickness of 100 nm-500 nm.

Figure 3:
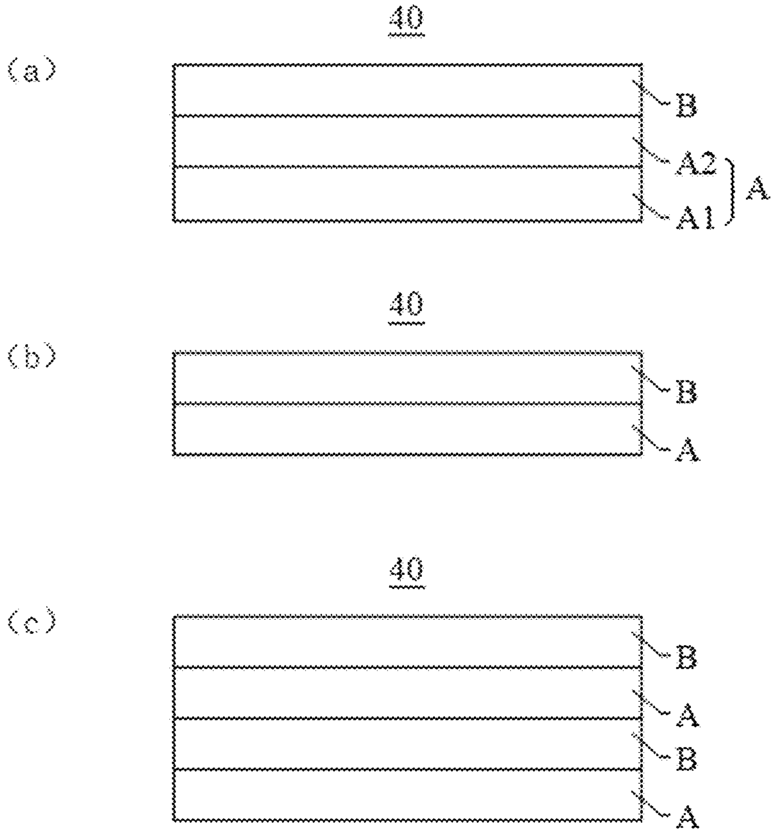
FIG. 3 is a schematic structural diagram illustrating three examples of an enhanced reflection coating of the windshield in FIG. 1.

Referring to FIG. 3, FIG. 3 is a schematic structural diagram illustrating three examples of the enhanced reflection coating 40 of the windshield 100 in FIG. 1. In FIG. 3, figure (a) illustrates that the enhanced reflection coating 40 includes one laminated structure, that is, a high refractive-index layer A and a low refractive-index layer B are arranged in sequence. The high refractive-index layer A includes two high refractive-index sub-layers, that is, the high refractive-index layer A includes a first high refractive-index sub-layer A1 and a second high refractive-index sub-layer A2 which are stacked in sequence, and the first high refractive-index sub-layer A1 is closer to the fourth surface 22 than the second high refractive-index sub-layer A2. In this embodiment, the first high refractive-index sub-layer A1 is in contact with the fourth surface 22, and the second high refractive-index sub-layer A2 is stacked on the first high refractive-index sub-layer A1. The first high refractive-index sub-layer A1 has a refractive index of 1.7~2.04. The second high refractive-index sub-layer A2 has a refractive index of 2.05~2.7. Preferably, the first high refractive-index sub-layer A1 is made of $SiO_xN_y$, where $1<x\leq3$, $1<y<3$. The first high refractive-index sub-layer A1 has a thickness of 27 nm~51 nm, and the second high refractive-index sub-layer A2 has a thickness of 45 nm~60 nm. In FIG. 3, figure (b) illustrates that the enhanced reflection coating 40 includes one laminated structure, that is, a high refractive-index layer A and a low refractive-index layer B are arranged in sequence. In FIG. 3, figure (c) illustrates that the enhanced reflection coating 40 includes two laminated structures, that is, a high refractive-index layer A, a low refractive-index layer B, another high refractive-index layer A, and another low refractive-index layer B are arranged in sequence.

In the disclosure, the high refractive-index layer may be made of any one of $SiN_x$, $SiAlN_x$, $SiBN_x$, $SiTiN_x$, $SiZrN_x$, $TiO_x$, $NbO_x$, $ZrO_x$, $SiN_xO_y$, $SiBN_xO_y$, $SiTiN_xO_y$, $SiAlN_xO_y$, $SiZrN_xO_y$, $ZnO_x$, $ZnAlO_x$, and $ZnSnO_x$. The low refractive-index layer may be made of any one of $SiO_x$, $SiBO_x$, $SiTiO_x$, $SiAlO_x$, and $SiZrO_x$. The low refractive-index layer has a thickness of 35 nm~60 nm.

Figure 4:
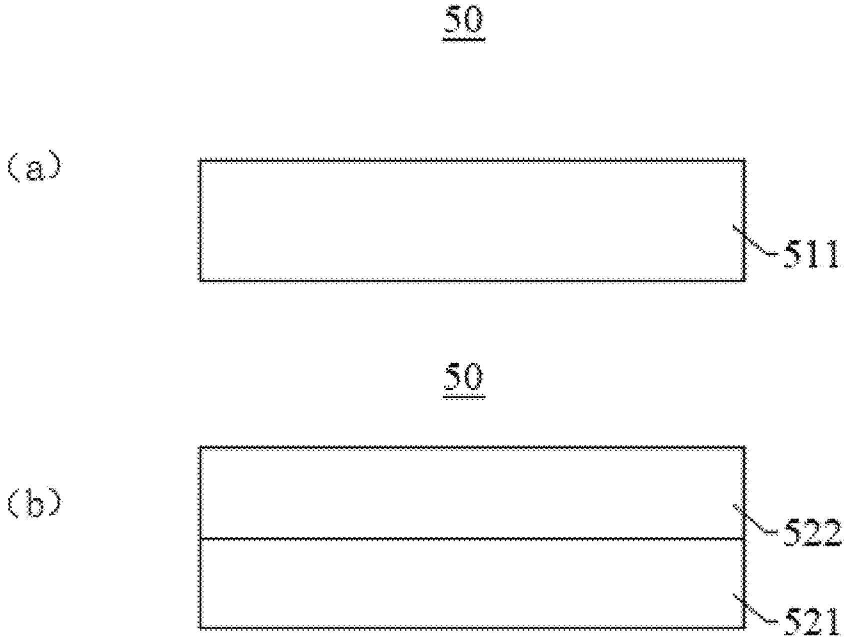
FIG. 4 is a schematic structural diagram of a dielectric coating of the windshield in FIG. 1.

Referring to FIG. 4, FIG. 4 is a schematic structural diagram of the dielectric coating 50 of the windshield 100 in FIG. 1. In FIG. 4, figure (a) is a schematic structural diagram illustrating that the dielectric coating 50 is a single-layer dielectric sub-layer, figure (b) is a schematic structural diagram illustrating that the dielectric coating 50 has two dielectric sub-layers. As illustrated in figure (a) of FIG. 4, the dielectric coating 50 is a single-layer dielectric sub-layer 511, and the dielectric sub-layer 511 has a refractive index of 2.2~2.7 and a thickness of 10 nm~70 nm. As illustrated in figure (b) of FIG. 4, the dielectric coating 50 includes two dielectric sub-layers (i.e., a first dielectric sub-layer 521 and a second dielectric sub-layer 522). A total thickness of the first dielectric sub-layer 521 and the second dielectric sub-layer 522 ranges from 10 nm to 140 nm. The first dielectric sub-layer 521 is in direct contact with the second side face 42 of the enhanced reflection coating 40. The first dielectric sub-layer 521 has a refractive index of 2.0~2.7. The second dielectric sub-layer 522 is disposed away from the second side face 42 of the enhanced reflection coating 40. The second dielectric sub-layer 522 has a refractive index of 2.2~2.7. The disclosure is not limited thereto. In the disclosure, for example, the dielectric coating 50 may be a single-layer dielectric sub-layer, where the single-layer dielectric sub-layer has a refractive index of 1.4~1.6, or 1.7~2.0. For another example, the dielectric coating 50 may include two dielectric sub-layers, where one of two dielectric sub-layers has a refractive index of 1.4~1.9, and the other of the two dielectric sub-layers has a refractive index of 2.0~2.7. It is understood that in other embodiments, the dielectric coating 50 may have multiple dielectric sub-layers, such as three dielectric sub-layers, five dielectric sub-layers, eight dielectric sub-layers, etc.

Figure 5:
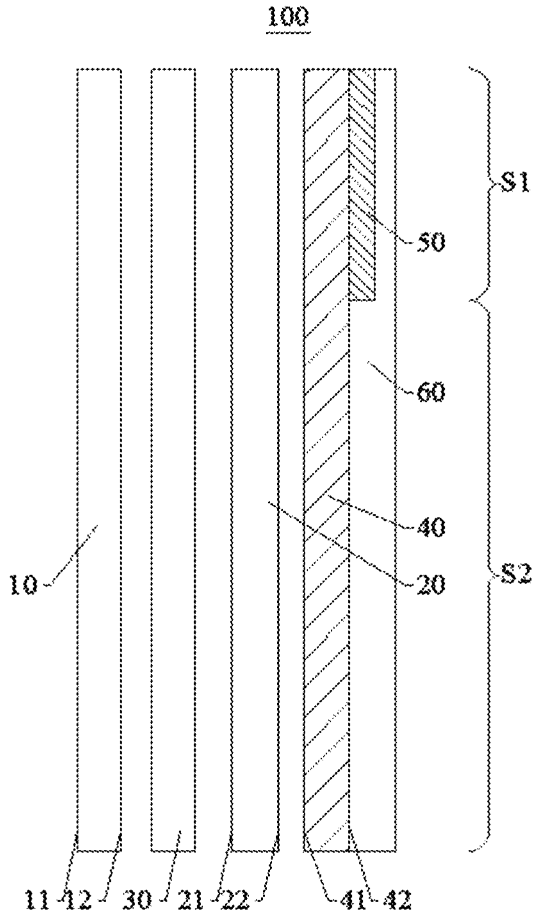
FIG. 5 is a schematic cross-sectional structural view of a windshield according to an embodiment of the disclosure.

FIG. 5 is a schematic cross-sectional structural view of the windshield 100 according to an embodiment of the disclosure. The windshield 100 in FIG. 5 differs from the windshield 100 in FIG. 1 as follows. The windshield 100 in FIG. 5 further includes a hydrophobic coating 60 laminated on a side face of the dielectric coating 50 away from the enhanced reflection coating 40. Specifically, the windshield 100 in FIG. 5 includes the outer glass 10, the polymer interlayer 30, the inner glass 20, the enhanced reflection layer 40, the dielectric coating 50, and the hydrophobic coating 60 laminated in sequence. The hydrophobic coating 60 has a water contact angle greater than 110° and a thickness less than 50 nm, and has functions such as hydrophobicity, anti-fouling, and even anti-fingerprint properties.

In some embodiments, the hydrophobic coating 60 is an organic polymer film prepared by a sol-gel process. For example, the hydrophobic coating 60 may be made of an anti-fingerprint (AF) material. The AF material may include at least one of 1H, 1H,2H,2H-Perfluorodecyltrimethoxysilane, 1H, 1H,2H,2H-Perfluorooctyltriethoxysilane, decatrifluoropropyltrimethoxysilane, dodecafluoroheptylpropyltrimethoxysilane, (3,3,3-Trifluoropropyl)Trimethoxysilane, methyltrichlorosilane, dichloro-n-dodecylmethylsilane, dimethyldichlorosilane, methylphenyldichlorosilane, methylvinyldichlorosilane, or trichloro(3,3,3-trifluoropropyl) silane.

In some embodiments, the hydrophobic coating 60 is made of an AF material with low surface energy. For example, the AF material has a surface energy less than or equal to 0.3 $Jm^{-2}$ and a refractive index less than or equal to 1.6. With the aid of a material with a low surface energy, a better anti-fingerprint effect can be achieved.

In some embodiments of the disclosure, at least one of the outer glass 10 or the inner glass 20 is ultra-clear glass. Preferably, both the outer glass 10 and the inner glass 20 are ultra-clear glass. The ultra-clear glass has a total iron content less than or equal to 0.015% wt, and a visible light transmittance greater than or equal to 91%. The ultra-clear glass is beneficial to improving a transmittance of the windshield 100 for near-infrared light of 780 nm~980 nm that is emitted/received by the LiDAR, thereby improving the detection accuracy of the LiDAR. The polymer interlayer 30 may be made of at least one of polyvinyl butyral (PVB), ethylene vinyl acetate (EVA), or sentry glass plus (SGP).

Figure 6:
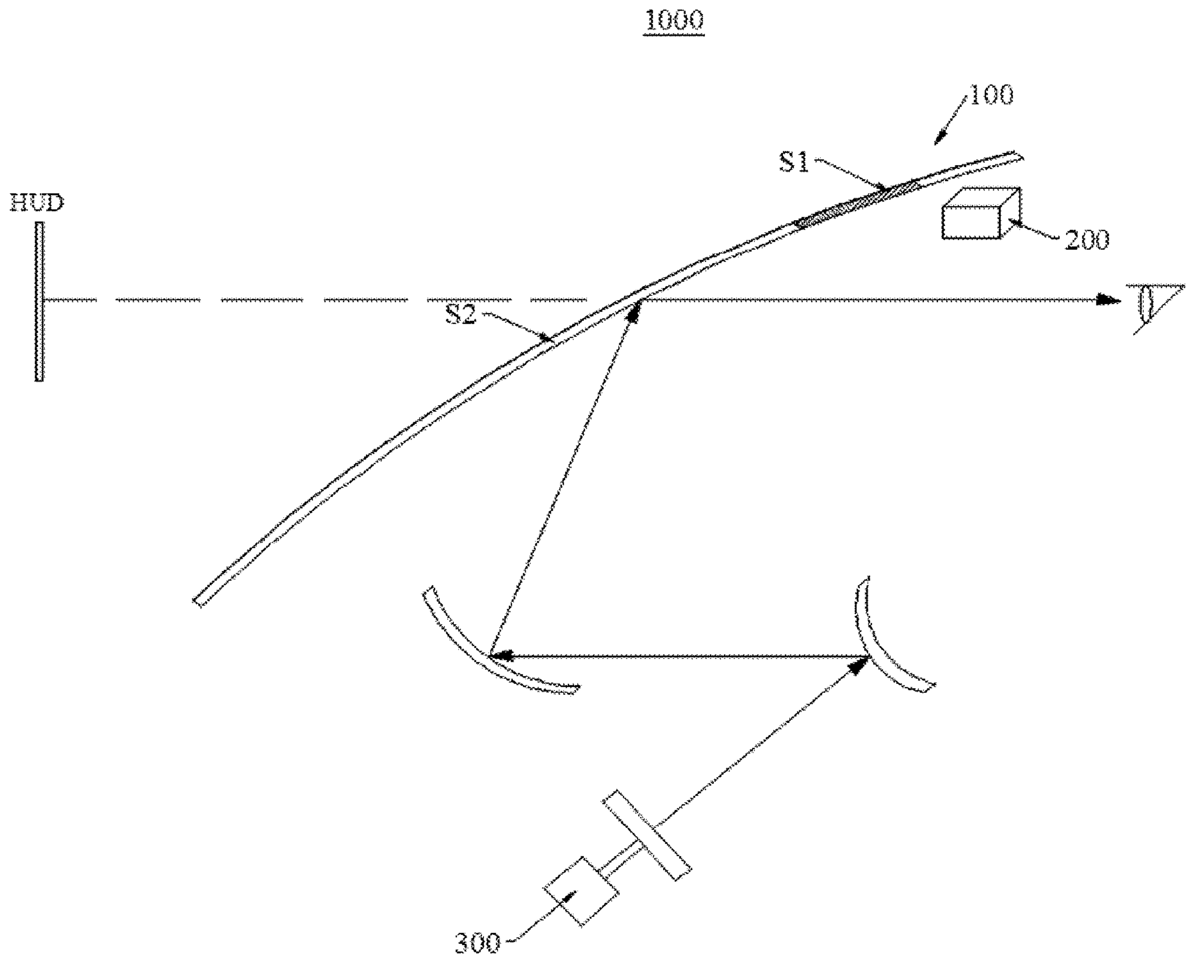
FIG. 6 is a schematic structural diagram of a windshield assembly according to an embodiment of the disclosure.

Referring to FIG. 6, a windshield assembly 1000 is further provided in the embodiments of the disclosure. The windshield assembly 1000 includes the windshield 100, a LiDAR 200, and an HUD projection device 300. The LiDAR 200 and the HUD projection device 300 are both mounted inside a vehicle. The LiDAR 200 is configured to emit/receive near-infrared light of 780 nm~980 nm that is to pass through the information collection region S. In this embodiment, the near-infrared light emitted by the LiDAR 200 may sequentially pass through the dielectric coating 50, the enhanced reflection coating 40, the inner glass 20, the polymer interlayer 30, and the outer glass 10 to the exterior of the vehicle. The near-infrared light to be received may sequentially pass through the outer glass 10, the polymer interlayer 30, the inner glass 20, the enhanced reflection coating 40, and the dielectric coating 50, and eventually be received by the LiDAR 200 inside the vehicle. The HUD projection device 300 is configured to generate P-polarized light of 380 nm~780 nm that is to be incident onto the non-information collection region S2. In this embodiment, the P-polarized light is incident onto the enhanced reflection coating 40 in the non-information collection region S2.

In the information collection region S1, the dielectric coating 50 and the enhanced reflection coating 40 cooperatively form an anti-reflective structure to improve a transmittance of the information collection region S1 for near-infrared light of 780 nm~980 nm. The near-infrared light has a P-polarized component and an S-polarized component. In order to further improve the detection precision of the LiDAR, preferably, a proportion of the P-polarized component in the near-infrared light emitted by the LiDAR is greater than or equal to 50%. For example, the proportion of the P-polarized component in the near-infrared light emitted by the LiDAR may be 50%, 55%, 60%, 70%, 80%, 90%, 95%, 100%, etc. More preferably, the proportion of the P-polarized component in the near-infrared light emitted by the LiDAR is 100%, that is, the entire near-infrared light emitted by the LiDAR is P-polarized light. This can be understood as the entire or substantially entire near-infrared light emitted by the LiDAR being P-polarized light.

In the non-information collection region S2, the enhanced reflection coating 40 can reflect P-polarized light of 380 nm~780 nm. In order to improve the definition and contrast of an HUD image, preferably, a proportion of a P-polarized component in polarized light generated by the HUD projection device is greater than or equal to 90%. For example, the proportion of the P-polarized component in the polarized light generated by the HUD projection device may be 91%, 92%, 93%, 94%, 95%, 96%, 97%, 98%, 99%, 100%, etc. More preferably, the proportion of the P-polarized component in the polarized light generated by the HUD projection device is 100%, that is, the entire P-polarized light generated by the HUD projection device is P-polarized light. This can be understood as the entire or substantially entire P-polarized light generated by the HUD projection device being P-polarized light.

Specific examples of the enhanced reflection coating 40 and the dielectric coating 50 of the windshield 100 are described in the following embodiments.

Rf(λ)-θ represents a reflectivity of the non-information collection region of the windshield for P-polarized light of wavelength λ incident at an incident angle of θ from one side of the fourth surface. In the disclosure, examples of Rf(469 nm)-65°, Rf(529 nm)-65°, and Rf(629 nm)-65° are taken for illustration of a reflectivity of the non-information collection region for P-polarized light of 469 nm, 529 nm, or 629 nm incident at an incident angle of 65° from one side of the fourth surface.

L*a*b* represents reflected colors measured from the first surface 11 of the windshield 100 according to the CIE Lab color model, where L* represents a brightness value, a*represents a red-green chromaticity value, and b* represents a yellow-blue chromaticity value.

TL represents a visible light transmittance obtained by measurement according to standard ISO 9050, where a wavelength range of the visible light ranges from 380 nm to 780 nm.

T(λ)-θ represents a transmittance of the information collection region of the windshield for near-infrared light of wavelength λ incident at an incident angle of θ. In the disclosure, examples of T(905)-0°, T(905)-15°, T(905)-30°, T(905)-45°, T(905)-60°, and T(905)-65° are taken for illustration of a transmittance of the information collection region for near-infrared light of 905 nm incident at an incident angle of 0°, 15°, 30°, 45°, 60°, and 65°.

Embodiment 1

The windshield 100 in embodiment 1 includes the interlayer glass, the enhanced reflection coating 40, the dielectric coating 50, and the hydrophobic coating 60 laminated in sequence. The interlayer glass includes the outer glass 10, the polymer interlayer 30, and the inner glass 20 laminated in sequence. Both the outer glass 10 and the inner glass 20 are ultra-clear glass with a thickness of 2.1 mm. The polymer interlayer 30 is made of PVB with a thickness of 0.76 mm.

The enhanced reflection coating 40: through coating deposition via a magnetron sputtering coating line, a first high refractive-index sub-layer made of $SiO_xN_y$ (with a refractive index n=1.71, an extinction coefficient k=0.00185, and a thickness of 50.2 nm), a second high refractive-index sub-layer made of $TiO_x$ (with a thickness of 52.7 nm), and a low refractive-index layer made of $SiO_2$ (with a thickness of 117 nm) are sequentially deposited and stacked on the fourth surface 22 in a direction away from the fourth surface 22 of the inner glass 20.

The dielectric coating 50: through local coating deposition via a magnetron sputtering coating line and a mask plate, a dielectric sub-layer made of $Nb_2O_5$ (with a thickness of 36.6 nm) is directly deposited and stacked on part of the low refractive-index layer $SiO_2$ in the information collection region S1.

The hydrophobic coating 60: after preparation of the interlayer glass having the enhanced reflection coating 40 and the dielectric coating 50, the hydrophobic coating 60 is sprayed on the fourth surface 22, and then the hydrophobic coating 60 is dried. The hydrophobic coating 60 is made of 1H, 1H,2H,2H-Perfluorodecyltrimethoxysilane with a thickness of 15 nm. The hydrophobic coating 60 covers the dielectric coating 50 in the information collection region S1 and part of the enhanced reflection coating 40 in the non-information collection region S2.

Comparative Example 1

A windshield is provided in comparative example 1. The windshield in comparative example 1 differs from the windshield 100 in embodiment 1 in that the windshield in comparative example 1 is not provided with the dielectric coating 50 and the hydrophobic coating 60.

Measurement of optical indexes is performed on the windshield in embodiment 1 and the windshield in comparative example 1. A reflectivity of the non-information collection region S2 of the windshield for P-polarized light, reflected colors of visible light, and a visible light transmittance, etc., are measured. A transmittance of the information collection region S1 of the windshield for near-infrared light of 905 nm incident at various angles is measured. Results of the measurement are recorded to table 1.

TABLE 1

Optical indexes of the windshield in embodiment 1 and the windshield in comparative example 1

| | | | embodiment 1 | | comparative example 1 | |
|---|---|---|---|---|---|---|
| | | | material | thickness | material | thickness |
| laminated glass | | outer glass | ultra-clear glass | 2.1 mm | ultra-clear glass | 2.1 mm |
| | | polymer interlayer | PVB | 0.76 mm | PVB | 0.76 mm |
| | | inner glass | ultra-clear glass | 2.1 mm | ultra-clear glass | 2.1 mm |
| enhanced reflection coating | | first high refractive-index sub-layer | $SiO_xN_y$ | 50.2 nm | $SiO_xN_y$ | 50.2 nm |
| | | second high refractive-index sub-layer | $TiO_x$ | 52.7 nm | $TiO_x$ | 52.7 nm |
| | | low refractive-index layer | $SiO_2$ | 117 nm | $SiO_2$ | 117 nm |
| dielectric coating | | | $Nb_2O_5$ | 36.6 nm | / | / |
| hydrophobic coating | | | AF coating | 15 nm | / | / |
| non-information collection region S2 | reflectivity for P-polarized light | Rf(469 nm)-65° | 20.7% | | 20.7% | |
| | | Rf(529 nm)-65° | 23% | | 23% | |
| | | Rf(629 nm)-65° | 20.6% | | 20.6% | |
| | L* a* b* | L* | 55.8 | | 55.8 | |
| | | a* | 0.4 | | 0.4 | |
| | | b* | −6.1 | | −6.1 | |
| | visible light transmittance | TL | 75.8% | | 75.8% | |
| information collection region S1 | transmittance for near-infrared light of 905 nm | T(905 nm)-0° | 85.5% | | 77.4% | |
| | | T(905 nm)-15° | 86.4% | | 76.9% | |
| | | T(905 nm)-30° | 88.4% | | 75.3% | |
| | | T(905 nm)-45° | 89.2% | | 72.4% | |
| | | T(905 nm)-60° | 84.5% | | 67% | |
| | | T(905 nm)-65° | 80% | | 62.9% | |

It can be seen from table 1 that a reflectivity of the non-information collection region S2 for P-polarized light in both embodiment 1 and comparative example 1 is greater than 20%, thereby achieving a good HUD function. In particular, a reflectivity of the non-information collection region S2 for P-polarized light of red (629 nm), green (529 nm), and blue (469 nm) is also greater than 20%, and a reflectivity difference therebetween is less than or equal to 2.5%, thereby achieving more uniform red, green, and blue colors of an HUD display image. A reflectivity of the non-information collection region S2 for P-polarized light of green (529 nm) is also greater than a reflectivity of the non-information collection region S2 for P-polarized light of red (629 nm) or blue (469 nm). L*a*b* values of a reflected color and the visible light transmittance TL of the non-information collection region S2 also indicate that the windshield is capable of satisfying the safety requirements for use of automobiles and that a good-looking light-blue color can be exhibited when the windshield is viewed from the outside.

In addition, compared with comparative example 1, the windshield in embodiment 1 is further provided with the dielectric coating 50 in the information collection region S1, making the information collection region S1 have a high transmittance of more than 80% for near-infrared light of 905 nm incident at an incident angle of 0°~65°. The information collection region S1 in comparative example 1 has a transmittance of less than 80% for near-infrared light of 905 nm incident at an incident angle of 0°~65°. Furthermore, with the increase in the incident angle, the transmittance of the information collection region S1 in comparative example 1 for the incident near-infrared light of 905 nm will significantly decrease, and even fall below 70%. The dielectric coating 50 and the enhanced reflection coating 40 in embodiment 1 cooperatively form an anti-reflective structure, such that a transmittance of the information collection region S1 in embodiment 1 for near-infrared light of 905 nm incident at an incident angle of 0°~65° increases by 8.1%~17.5%, thereby ensuring normal operation of the LiDAR within the maximum horizontal FOV of 120°, and improving the detection range and detection precision of the LiDAR, and achieving the stability and accuracy of the operation of the LiDAR that is internally mounted.

In addition, compared with comparative example 1, the windshield in embodiment 1 is further coated with the hydrophobic coating 60, and thus has an anti-fouling and anti-fingerprint function, thereby improving the cleanliness of the windshield.

Embodiment 2

The windshield 100 in embodiment 2 includes the interlayer glass, the enhanced reflection coating 40, the dielectric coating 50, and the hydrophobic coating 60 laminated in sequence. The interlayer glass includes the outer glass 10, the polymer interlayer 30, and the inner glass 20 laminated in sequence. Both the outer glass 10 and the inner glass 20 are ultra-clear glass with a thickness of 2.1 mm. The polymer interlayer 30 is made of PVB with a thickness of 0.76 mm.

The enhanced reflection coating 40: through coating deposition via a magnetron sputtering coating line, a high refractive-index layer made of $SiO_xN_y$ (with a refractive index n=1.71, an extinction coefficient k=0.00185, and a thickness of 27.6 nm), a low refractive-index layer made of $SiO_2$ (with a thickness of 56.5 nm), a high refractive-index layer made of $TiO_x$ (with a thickness of 57.3 nm), and a low refractive-index layer made of $SiO_2$ (with a thickness of 120.5 nm) are sequentially deposited and stacked on the fourth surface 22 in a direction away from the fourth surface 22.

The dielectric coating 50: through local coating deposition via a magnetron sputtering coating line and a mask plate, a dielectric sub-layer made of $TiO_x$ (with a thickness of 25.5 nm) is directly deposited and stacked on part of the low refractive-index layer made of $SiO_2$ in the information collection region S1.

The hydrophobic coating 60: after preparation of the interlayer glass having the enhanced reflection coating 40 and the dielectric coating 50, the hydrophobic coating 60 is sprayed on the fourth surface 22, and then the hydrophobic coating 60 is dried. The hydrophobic coating 60 is made of 1H, 1H,2H,2H-Perfluorodecyltrimethoxysilane with a thickness of 15 nm. The hydrophobic coating 60 covers the dielectric coating 50 in the information collection region S1 and part of the enhanced reflection coating 40 in the non-information collection region S2.

Comparative Example 2

A windshield is provided in comparative example 2. The windshield in comparative example 2 differs from the windshield 100 in embodiment 2 in that the windshield in comparative example 2 is not provided with the dielectric coating 50 and the hydrophobic coating 60.

Measurement of optical indexes is performed on the windshield in embodiment 2 and the windshield in comparative example 2. A reflectivity of the non-information collection region S2 of the windshield for P-polarized light, reflected colors of visible light, and a visible light transmittance, etc., are measured. A transmittance of the information collection region S1 of the windshield for near-infrared light of 905 nm incident at various angles is measured. Results of the measurement are recorded to table 2.

TABLE 2

Optical indexes of the windshield in embodiment 2 and the windshield in comparative example 2

| | | embodiment 2 | | comparative example 2 | |
|---|---|---|---|---|---|
| | | material | thickness | material | thickness |
| laminated glass | outer glass | ultra-clear glass | 2.1 mm | ultra-clear glass | 2.1 mm |
| | polymer interlayer | PVB | 0.76 mm | PVB | 0.76 mm |
| | inner glass | ultra-clear glass | 2.1 mm | ultra-clear glass | 2.1 mm |
| enhanced reflection coating | high refractive-index layer | $SiO_xN_y$ | 27.6 nm | $SiO_xN_y$ | 27.6 nm |
| | low | $SiO_2$ refractive-index layer | 56.5 nm | $SiO_2$ | 56.5 nm |
| | high refractive-index layer | $TiO_x$ | 57.3 nm | $TiO_x$ | 57.3 nm |
| | low refractive-index layer | $SiO_2$ | 120.5 nm | $SiO_2$ | 120.5 nm |
| dielectric coating | | $TiO_x$ | 25.5 nm | / | / |
| hydrophobic coating | | AF coating | 15 nm | / | / |

TABLE 2-continued

Optical indexes of the windshield in embodiment 2 and the windshield in comparative example 2

| | | | embodiment 2 | | comparative example 2 | |
|---|---|---|---|---|---|---|
| | | | material | thickness | material | thickness |
| non-information collection region S2 | reflectivity for P-polarized light | Rf(469 nm)-65° | 21.1% | | 21.1% | |
| | | Rf(529 nm)-65° | 23.5% | | 23.5% | |
| | | Rf(629 nm)-65° | 21% | | 21% | |
| | L* a* b* | L* | 56.8 | | 56.8 | |
| | | a* | 0.4 | | 0.4 | |
| | | b* | −8.5 | | −8.5 | |
| | visible light transmittance | TL | 71.5% | | 71.5% | |
| information collection region S1 | transmittance for near-infrared light of 905 nm | T(905 nm)-0° | 87.2% | | 78.9% | |
| | | T(905 nm)-15° | 87.9% | | 78.4% | |
| | | T(905 nm)-30° | 89.5% | | 76.8% | |
| | | T(905 nm)-45° | 89.8% | | 73.8% | |
| | | T(905 nm)-60° | 84.8% | | 68% | |
| | | T(905 nm)-65° | 80.2% | | 64.4% | |

It can be seen from table 2 that a reflectivity of the non-information collection region S2 for P-polarized light in both embodiment 2 and comparative example 2 is greater than 20%, thereby achieving a good HUD function. In particular, a reflectivity of the non-information collection region S2 for P-polarized light of red (629 nm), green (529 nm), and blue (469 nm) is also greater than 20%, and a reflectivity difference therebetween is less than or equal to 2.5%, thereby achieving more uniform red, green, and blue colors of an HUD display image. A reflectivity of the non-information collection region S2 for P-polarized light of green (529 nm) is also greater than a reflectivity of the non-information collection region S2 for P-polarized light of red (629 nm) or blue (469 nm). L*a*b* values of a reflected color and the visible light transmittance TL of the non-information collection region S2 also indicate that the windshield is capable of satisfying the safety requirements for use of automobiles and that a good-looking light-blue color can be exhibited when the windshield is viewed from the outside.

In addition, compared with comparative example 2, the windshield in embodiment 2 is further provided with the dielectric coating 50 in the information collection region S1, making the information collection region S1 have a high transmittance of more than 80% for near-infrared light of 905 nm incident at an incident angle of 0°~65°. The information collection region S1 in comparative example 2 has a transmittance of less than 80% for near-infrared light of 905 nm incident at an incident angle of 0°~65°. Furthermore, with the increase in the incident angle, the transmittance of the information collection region S1 in comparative example 2 for the incident near-infrared light of 905 nm will significantly decrease, and even fall below 70%. The dielectric coating 50 and the enhanced reflection coating 40 in embodiment 2 cooperatively form an anti-reflective structure, such that a transmittance of the information collection region S1 in embodiment 2 for near-infrared light of 905 nm incident at an incident angle of 0°~65° increases by 8.3%~16.8%, thereby ensuring normal operation of the LiDAR within the maximum horizontal FOV of 120°, and improving the detection range and detection precision of the LiDAR, and achieving the stability and accuracy of the operation of the LiDAR that is internally mounted.

In addition, compared with comparative example 2, the windshield in embodiment 2 is further coated with the hydrophobic coating 60, and thus has an anti-fouling and anti-fingerprint function, thereby improving the cleanliness of the windshield.

Embodiment 3

The windshield 100 in embodiment 3 includes the interlayer glass, the enhanced reflection coating 40, and the dielectric coating 50 laminated in sequence. The interlayer glass includes the outer glass 10, the polymer interlayer 30, and the inner glass 20 laminated in sequence. Both the outer glass 10 and the inner glass 20 are ultra-clear glass with a thickness of 2.1 mm. The polymer interlayer 30 is made of PVB with a thickness of 0.76 mm.

The enhanced reflection coating 40: through coating deposition via a magnetron sputtering coating line, a high refractive-index layer made of $SiO_xN_y$ (with a refractive index n=1.71, an extinction coefficient k=0.00185, and a thickness of 27.7 nm), a low refractive-index layer made of $SiO_2$ (with a thickness of 38.9 nm), a first high refractive-index sub-layer made of $SiN_x$ (with a thickness of 17.5 nm), a second high refractive-index sub-layer made of $TiO_x$ (with a thickness of 47.7 nm), and a low refractive-index layer made of $SiO_2$ (with a thickness of 124.9 nm) are sequentially deposited and stacked on the fourth surface 22 in a direction away from the fourth surface 22.

The dielectric coating 50: through local coating deposition via a magnetron sputtering coating line and a mask plate, a first dielectric sub-layer made of $ZnSnO_x$ (with a thickness of 14.3 nm) and a second dielectric sub-layer made of $TiO_x$ (with a thickness of 17.2 nm) are directly deposited and stacked on the low refractive-index layer $SiO_2$ in the information collection region S1.

Comparative Example 3

A windshield is provided in comparative example 3. The windshield in comparative example 3 differs from the windshield 100 in embodiment 3 in that the windshield in comparative example 3 is not provided with the dielectric coating 50.

Measurement of optical indexes is performed on the windshield in embodiment 3 and the windshield in comparative example 3. A reflectivity of the non-information collection region S2 of the windshield for P-polarized light, reflected colors of visible light, and a visible light transmittance, etc., are measured. A transmittance of the information collection region S1 of the windshield for near-infrared light of 905 nm incident at various angles is measured. Results of the measurement are recorded to table 3.

TABLE 3

Optical indexes of the windshield in embodiment 3 and the windshield in comparative example 3

| | | | embodiment 3 | | comparative example 3 | |
|---|---|---|---|---|---|---|
| | | | material | thickness | material | thickness |
| laminated glass | | outer glass | ultra-clear glass | 2.1 mm | ultra-clear glass | 2.1 mm |
| | | polymer interlayer | PVB | 0.76 mm | PVB | 0.76 mm |
| | | inner glass | ultra-clear glass | 2.1 mm | ultra-clear glass | 2.1 mm |
| enhanced reflection coating | | high refractive-index layer | $SiO_xN_y$ | 27.7 nm | $SiO_xN_y$ | 27.7 nm |
| | | low refractive-index layer | $SiO_2$ | 38.9 nm | $SiO_2$ | 38.9 nm |
| | | first high refractive-index sub-layer | $SiN_x$ | 17.5 nm | $SiN_x$ | 17.5 nm |
| | | second high refractive-index sub-layer | $TiO_x$ | 47.7 nm | $TiO_x$ | 47.7 nm |
| | | low refractive-index layer | $SiO_2$ | 124.9 nm | $SiO_2$ | 124.9 nm |
| dielectric coating | | first dielectric sub-layer | $ZnSnO_x$ | 14.3 nm | / | / |
| | | second dielectric sub-layer | $TiO_x$ | 17.2 nm | / | / |
| non-information collection regionS2 | reflectivity for P-polarized light | Rf(469 nm)-65° | 20.5% | | 20.5% | |
| | | Rf(529 nm)-65° | 22.2% | | 22.2% | |
| | | Rf(629 nm)-65° | 20.5% | | 20.5% | |
| | L* a* b* | L* | 56 | | 56 | |
| | | a* | 0.3 | | 0.3 | |
| | | b* | −8.9 | | −8.9 | |
| | visible light transmittance | TL | 72.7% | | 72.7% | |
| information collection regionS1 | transmittance for near-infrared light of 905 nm | T(905 nm)-0° | 86.3% | | 80.2% | |
| | | T(905 nm)-15° | 87.1% | | 79.7% | |
| | | T(905 nm)-30° | 88.8% | | 78% | |
| | | T(905 nm)-45° | 89.4% | | 74.9% | |
| | | T(905 nm)-60° | 84.6% | | 68.7% | |
| | | T(905 nm)-65° | 80.1% | | 65% | |

It can be seen from table 3 that a reflectivity of the non-information collection region S2 for P-polarized light in both embodiment 3 and comparative example 3 is greater than 20%, thereby achieving a good HUD function. In particular, a reflectivity of the non-information collection region S2 for P-polarized light of red (629 nm), green (529 nm), and blue (469 nm) is also greater than 20%, and a reflectivity difference therebetween is less than or equal to 1.7%, thereby achieving more uniform red, green, and blue colors of an HUD display image. A reflectivity of the non-information collection region S2 for P-polarized light of green (529 nm) is also greater than a reflectivity of the non-information collection region S2 for P-polarized light of red (629 nm) or blue (469 nm). L*a*b* values of a reflected color and the visible light transmittance TL of the non-information collection region S2 also indicate that the windshield is capable of satisfying the safety requirements for use of automobiles and that a good-looking light-blue color can be exhibited when the windshield is viewed from the outside.

In addition, compared with comparative example 3, the windshield in embodiment 3 is further provided with the dielectric coating 50 in the information collection region S1, making the information collection region S1 have a high transmittance of more than 80% for near-infrared light of 905 nm incident at an incident angle of 0°~65°. The maximum transmittance of the information collection region S1 in comparative example 3 for near-infrared light of 905 nm incident at an incident angle of 0°~65° is 80.2%. Furthermore, with the increase in the incident angle, the transmittance of the information collection region S1 in comparative example 3 for the incident near-infrared light of 905 nm will significantly decrease, and even fall below 70%. The dielectric coating 50 and the enhanced reflection coating 40 in embodiment 3 cooperatively form an anti-reflective structure, such that a transmittance of the information collection region S1 in embodiment 3 for near-infrared light of 905 nm incident at an incident angle of 0°~65° increases by 6.1%~15.9%, thereby ensuring normal operation of the LiDAR within the maximum horizontal FOV of 120°, and improving the detection range and detection precision of the LiDAR, and achieving the stability and accuracy of the operation of the LiDAR that is internally mounted.

Embodiments 4 to 6

A windshield in embodiment 4 is substantially the same as the windshield in embodiment 1 except the following. The dielectric coating 50 in embodiment 4 is made of $SiO_xN_y$ (with a refractive index n=1.71, an extinction coefficient k=0.00185, and a thickness of 78.5 nm).

A windshield in embodiment 5 is substantially the same as the windshield in embodiment 1 except the following. The dielectric coating 50 in embodiment 5 includes two dielectric sub-layers, the first dielectric sub-layer is made of $TiO_x$ (with a thickness of 13.4 nm), and the second dielectric sub-layer is made of $SiO_xN_y$ (with a refractive index of n=1.71, an extinction coefficient of k=0.00185, and a thickness of 55.4 nm).

A windshield in embodiment 6 is substantially the same as the windshield in embodiment 1, except the following. The dielectric coating 50 in embodiment 6 includes two dielectric sub-layers, the first dielectric sub-layer is made of $ZnSnO_x$ (with a thickness of 8.1 nm), and the second dielectric sub-layer is made of $SiO_2$ (with a thickness of 98.9 nm).

Measurement of optical indexes is performed on the windshield in embodiment 4, the windshield in embodiment 5, and the windshield in embodiment 6. A transmittance of the information collection region S1 of the windshield for near-infrared light of 905 nm incident at various angles is measured. Results of the measurement are recorded to table 4.

TABLE 4

Optical indexes of the windshield in embodiment 4, the windshield in embodiment 5, and the windshield in embodiment 6

| | | | embodiment 4 | embodiment 5 | embodiment 6 |
|---|---|---|---|---|---|
| dielectric coating | | first dielectric sub-layer | $SiO_xN_y$ 78.5 nm | $TiO_x$ 13.4 nm | $ZnSnO_x$ 8.1 nm |
| | | second dielectric sub-layer | — | $SiO_xN_y$ 55.4 nm | $SiO_2$ 98.9 nm |
| information collection region S1 | transmittance for near-infrared light of 905 nm | T(905 nm)-0° | 80% | 80.1% | 80% |
| | | T(905 nm)-15° | 81.1% | 81.2% | 80.9% |
| | | T(905 nm)-30° | 83.6% | 84.2% | 83.1% |
| | | T(905 nm)-45° | 85.3% | 86.3% | 84.6% |
| | | T(905 nm)-60° | 81.8% | 82.8% | 81.1% |
| | | T(905 nm)-65° | 77.6% | 78.5% | 77.1% |

It can be seen from table 4 that, compared with embodiment 1, a transmittance of the information collection region S1 in each of embodiments 4 to 6 for near-infrared light of 905 nm incident at an incident angle of 65° is less than 80%. However, compared with comparative example 1, the information collection region S1 in each of embodiments 4 to 6 has a high transmittance of more than 80% for near-infrared light of 905 nm incident at an incident angle of 0°~60°. The information collection region S1 in comparative example 1 has a transmittance of less than 80% for near-infrared light of 905 nm incident at an incident angle of 0°~60°. Furthermore, with the increase in the incident angle, a transmittance of the information collection region S1 in comparative example 1 for the incident near-infrared light of 905 nm will significantly decrease, and even fall below 70%. The dielectric coating 50 and the enhanced reflection coating 40 in each of embodiments 4 to 6 cooperatively form an anti-reflective structure, such that a transmittance of the information collection region S1 in each of embodiments 4 to 6 for near-infrared light of 905 nm incident at an incident angle of 0°~60° increases by 2.6%~14.1%, thereby improving the detection range and detection precision of the LiDAR, and achieving the stability and accuracy of the operation of the LiDAR that is internally mounted.

Although the windshield of the disclosure has been described in detail, the disclosure is not limited to the above embodiments, and thus any improvements, equivalent modifications, and replacements based on the technical points of the disclosure shall belong to the scope of protection of the disclosure.

What is claimed is:

1. A windshield, comprising an outer glass, a polymer interlayer, and an inner glass, wherein the polymer interlayer is sandwiched between the outer glass and the inner glass, the outer glass has a first surface and a second surface opposite the first surface, the second surface faces the polymer interlayer, the inner glass has a third surface and a fourth surface opposite the third surface, the third surface faces the polymer interlayer, and the windshield has an information collection region and a non-information collection region;

an enhanced reflection coating is provided on the fourth surface, wherein the enhanced reflection coating covers the information collection region and the non-information collection region, and the enhanced reflection coating is configured to improve a reflectivity of the non-information collection region for P-polarized light of 380 nm~780 nm, such that the non-information collection region has a reflectivity greater than or equal to 20% for P-polarized light of 380 nm~780 nm incident at an incident angle of 65°; and a dielectric coating is further provided in the information collection region, wherein the dielectric coating is disposed on a side face of the enhanced reflection coating away from the fourth surface, and the dielectric coating and the enhanced reflection coating are configured to improve a transmittance of the information collection region for near-infrared light of 780 nm~980 nm, such that the information collection region has a transmittance greater than or equal to 80% for near-infrared light of 780 nm~980 nm incident at an incident angle of 65°.

2. The windshield of claim 1, wherein the enhanced reflection coating has a thickness of 100 nm~500 nm and comprises at least one laminated structure, each of the at least one laminated structure comprises a high refractive-index layer and a low refractive-index layer sequentially deposited from the fourth surface in a direction away from the outer glass, the high refractive-index layer has a refractive index of 1.7~2.7, and the low refractive-index layer has a refractive index of 1.3~1.6.

3. The windshield of claim 2, wherein at least one of the following:

the high refractive-index layer comprises a plurality of high refractive-index sub-layers or the enhanced reflection coating comprises at least two laminated structures, wherein:

the plurality of high refractive-index layers comprise at least one first high refractive-index layer and at least one second high refractive-index layer, each of the at least one first high refractive-index layer is a single-layer high refractive-index sub-layer, and each of the at least one second high refractive-index layer comprises a plurality of high refractive-index sub-layers; or the low refractive-index layer comprises a plurality of low refractive-index sub-layers or the enhanced reflection coating comprises at least two laminated structures, wherein the plurality of low refractive-index layers comprise at least one first low refractive-index layer and at least one second low refractive-index layer, each of the at least one first low refractive-index layer is a single-layer low refractive-index sub-layer, and each of the at least one second low refractive-index layer comprises a plurality of low refractive-index sub-layers.

4. The windshield of claim 3, wherein when the high refractive-index layer comprises the plurality of high refractive-index sub-layers, each of the at least one second high refractive-index layers comprises a first high refractive-index sub-layer and a second high refractive-index sub-layer stacked in sequence, the first high refractive-index sub-layer is closer to the fourth surface than the second high refractive-index sub-layer, the first high refractive-index sub-layer has a refractive index of 1.7·~2.04, and the second high refractive-index sub-layer has a refractive index of 2.05·~2.7.

5. The windshield of claim 4, wherein the first high refractive-index sub-layer is made of $SiO_xN_y$, wherein $1<x\leq3$, $1<y<3$, the first high refractive-index sub-layer has a thickness of 27 nm·~51 nm, and the second high refractive-index sub-layer has a thickness of 45 nm·~60 nm.

6. The windshield of claim 1, wherein the dielectric coating has a thickness of 10 nm·~140 nm, the dielectric coating comprises at least one dielectric sub-layer, and each of the at least one dielectric sub-layer has a refractive index of 1.4·~2.7.

7. The windshield of claim 6, wherein each of the at least one dielectric sub-layers has a refractive index of 2.0·~2.7, and is made of at least one of $ZnSnO_x$, $ZnAlO_x$, $TiO_x$, $NbO_x$, $SiN_x$, $ZrO_x$, or $ZrSiN_x$.

8. The windshield of claim 6, wherein each of the at least one dielectric sub-layers has a refractive index of 2.2~2.7, and the dielectric coating has a thickness of 10 nm~70 nm.

9. The windshield of claim 1, wherein the non-information collection region has a reflectivity of Y1 for P-polarized light of 629 nm incident at an incident angle of 65°, a reflectivity of Y2 for P-polarized light of 529 nm incident at an incident angle of 65°, and a reflectivity of Y3 for P-polarized light of 469 nm incident at an incident angle of 65°, wherein $|Y1-Y2|\leq2.5\%$, $Y2-Y3|\leq2.5\%$, and $|Y1-Y3|\leq2.5\%$.

10. The windshield of claim 9, wherein $Y1\geq20\%$, $Y2\geq20\%$, and $Y3\geq20\%$.

11. The windshield of claim 1, further comprising a hydrophobic coating stacked on a side face of the dielectric coating away from the enhanced reflection coating.

12. The windshield of claim 11, wherein the hydrophobic coating has a water contact angle greater than 110°.

13. The windshield of claim 11, wherein the hydrophobic coating has a surface energy less than or equal to 0.3 $Jm^{-2}$, and has a refractive index less than or equal to 1.6.

14. The windshield of claim 1, wherein the dielectric coating is a single-layer dielectric sub-layer, and the dielectric sub-layer has a refractive index of 2.2~2.7 and a thickness of 10 nm~70 nm; or the dielectric coating comprises a first dielectric sub-layer and a second dielectric sub-layer, a total thickness of the first dielectric sub-layer and the second dielectric sub-layer ranges from 10 nm to 140 nm, the first dielectric sub-layer is in direct contact with the second side face of the enhanced reflection coating, the first dielectric sub-layer has a refractive index of 2.0~2.7, the second dielectric sub-layer is disposed away from the second side face of the enhanced reflection coating, and the second dielectric sub-layer has a refractive index of 2.2~2.7.

15. The windshield of claim 1, wherein the dielectric coating and the enhanced reflection coating cooperatively serve as an anti-reflective structure that has an anti-reflective effect for near-infrared light of 780 nm~980 nm, and the transmittance of the information collection region for near-infrared light of 780 nm~980 nm incident at an incident angle of 65° is greater than or equal to 80%.

16. A windshield assembly, comprising a light detection and ranging (LiDAR), a head-up display (HUD) projection device, and a windshield, wherein the windshield comprises an outer glass, a polymer interlayer, and an inner glass, wherein the polymer interlayer is sandwiched between the outer glass and the inner glass, the outer glass has a first surface and a second surface opposite the first surface, the second surface faces the polymer interlayer, the inner glass has a third surface and a fourth surface opposite the third surface, the third surface faces the polymer interlayer, and the windshield has an information collection region and a non-information collection region;

an enhanced reflection coating is provided on the fourth surface, wherein the enhanced reflection coating covers the information collection region and the non-information collection region, and the enhanced reflection coating is configured to improve a reflectivity of the non-information collection region for P-polarized light of 380 nm~780 nm, such that the non-information collection region has a reflectivity greater than or equal to 20% for P-polarized light of 380 nm~780 nm incident at an incident angle of 65°;

a dielectric coating is further provided in the information collection region, wherein the dielectric coating is disposed on a side face of the enhanced reflection coating away from the fourth surface, and the dielectric coating and the enhanced reflection coating are configured to improve a transmittance of the information collection region for near-infrared light of 780 nm~980 nm, such that the information collection region has a transmittance greater than or equal to 80% for near-infrared light of 780 nm~980 nm incident at an incident angle of 65°;

the LiDAR is configured to emit/receive near-infrared light of 780 nm~980 nm that is to pass through the information collection region; and the HUD projection device is configured to generate the P-polarized light of 380 nm~780 nm that is to be incident onto the non-information collection region.

17. The windshield assembly of claim 16, wherein a proportion of a P-polarized component in polarized light generated by the HUD projection device is greater than or equal to 90%.

18. The windshield assembly of claim 16, wherein a proportion of a P-polarized component in the near-infrared light emitted by the LiDAR is greater than or equal to 50%.

19. The windshield assembly of claim 16, wherein a proportion of a P-polarized component in polarized light generated by the HUD projection device is 100%, and a proportion of a P-polarized component in the near-infrared light emitted by the LiDAR is 100%.

* * * * *